(12) United States Patent
Kropp

(10) Patent No.: US 8,592,777 B2
(45) Date of Patent: Nov. 26, 2013

(54) INTEGRABLE MAGNETIC FIELD COMPENSATION FOR USE IN SCANNING AND TRANSMISSION ELECTRON MICROSCOPES

(75) Inventor: Peter A. Kropp, Mainz (DE)

(73) Assignee: Integrated Dynamics Engineering GmbH (DE)

( * ) Notice: Subject to any disclaimer, the term of this patent is extended or adjusted under 35 U.S.C. 154(b) by 0 days.

(21) Appl. No.: 13/540,783

(22) Filed: Jul. 3, 2012

(65) Prior Publication Data

US 2013/0009056 A1 Jan. 10, 2013

(30) Foreign Application Priority Data

Jul. 4, 2011 (DE) .......................... 10 2011 106 433

(51) Int. Cl.
*H01J 37/147* (2006.01)
(52) U.S. Cl.
CPC ......... *H01J 37/1475* (2013.01); *H01J 37/1471* (2013.01)
USPC ................... 250/396 ML; 250/306; 250/307; 250/310; 250/311; 250/396 R
(58) Field of Classification Search
CPC ................... H01J 2229/003; H01J 2229/0038; H01J 2229/0053
USPC ....... 250/306, 307, 310, 311, 396 R, 396 ML
See application file for complete search history.

(56) References Cited

U.S. PATENT DOCUMENTS

| | | | | | |
|---|---|---|---|---|---|
| 3,571,590 | A | * | 3/1971 | Katagiri et al. | 250/311 |
| 3,588,586 | A | * | 6/1971 | Yanaka | 15/379 |
| 4,963,789 | A | * | 10/1990 | Buhler | 315/8 |
| 6,838,675 | B2 | * | 1/2005 | Harada et al. | 250/396 ML |
| 7,075,075 | B2 | * | 7/2006 | Adamec et al. | 250/310 |
| 7,525,314 | B1 | * | 4/2009 | Heiland | 324/320 |
| 7,859,259 | B2 | * | 12/2010 | Heiland | 324/253 |
| 7,928,377 | B2 | * | 4/2011 | Ishitani et al. | 250/306 |
| 8,433,545 | B2 | * | 4/2013 | Kropp et al. | 702/194 |
| 2006/0097166 | A1 | | 5/2006 | Ishitani et al. | |
| 2012/0006997 | A1 | * | 1/2012 | Frosien | 250/396 ML |
| 2013/0009056 | A1 | * | 1/2013 | Kropp | 250/307 |

OTHER PUBLICATIONS

German Office Action, dated Feb. 12, 2012 for German Patent Application No. 10 2011 106 433.1.

* cited by examiner

*Primary Examiner* — David A Vanore
(74) *Attorney, Agent, or Firm* — Kaplan Breyer Schwarz & Ottesen, LLP

(57) ABSTRACT

An arrangement and a method for imaging, examining and processing a sample using electrons. The arrangement comprises an electron microscope for providing electrons, a chamber with a sample holder on which a sample is positionable such that it can be imaged, examined and processed using the electrons. A system for magnetic field compensation in at least one spatial direction, including a compensation coil, wherein a wall of the chamber has an accommodation area, in sections thereof, for a portion of the compensation coil. Generally, only the chamber in which the sample is arranged is considered as a compensation volume. It suffice to reduce the compensation volume to the sensitive region of the electron microscope, since it is in the chamber, shortly following a final focusing and filtering, where the electron beam is most sensitive in terms of image quality when subjected to external electromagnetic interference.

9 Claims, 9 Drawing Sheets

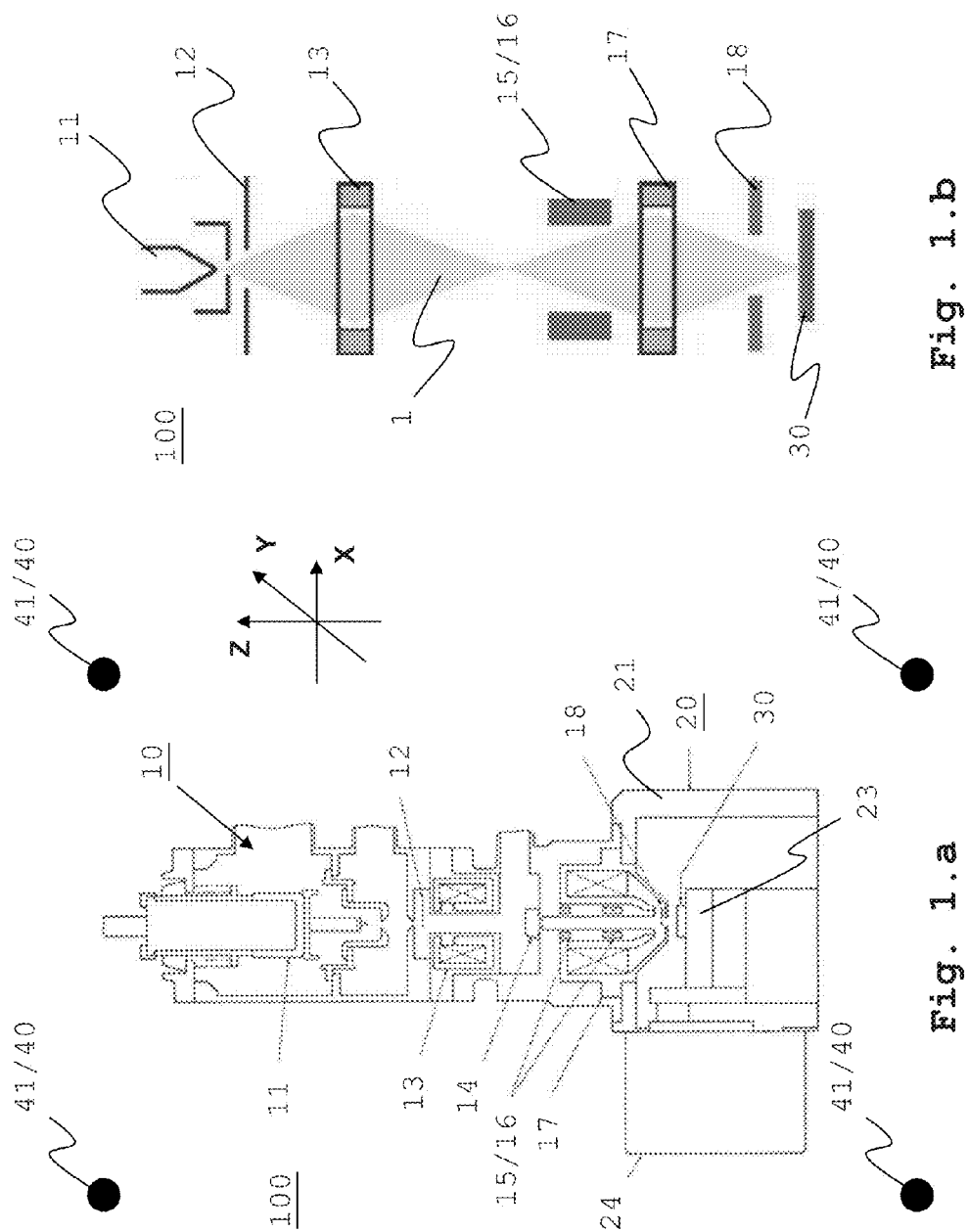

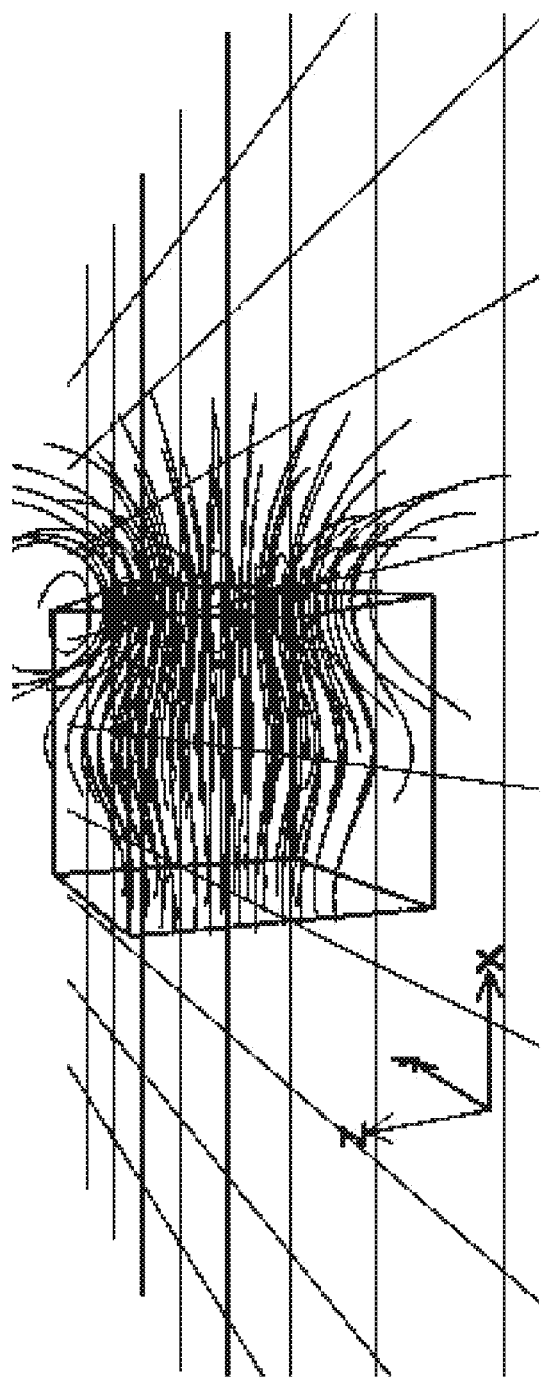
Fig. 1.c

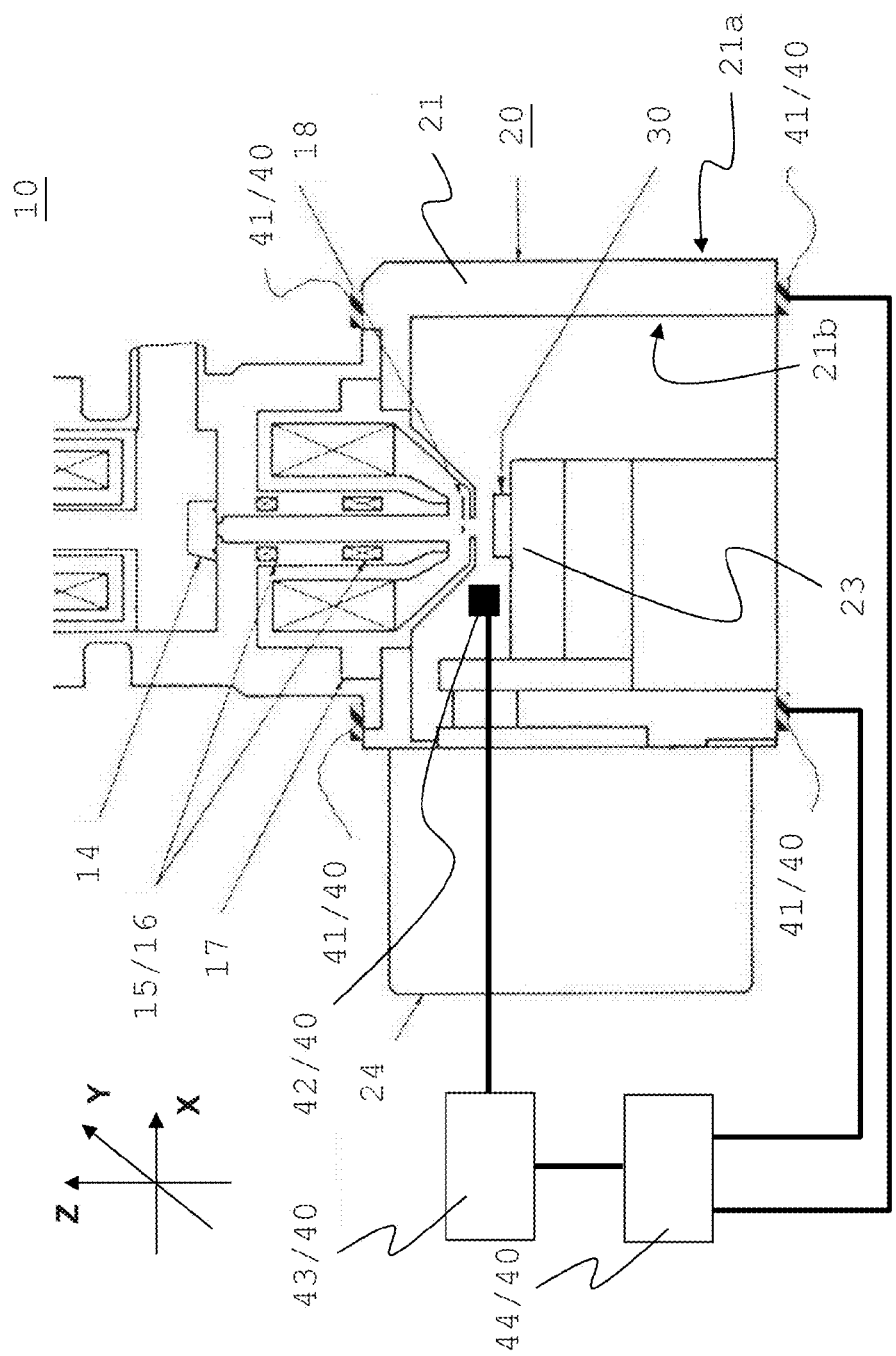

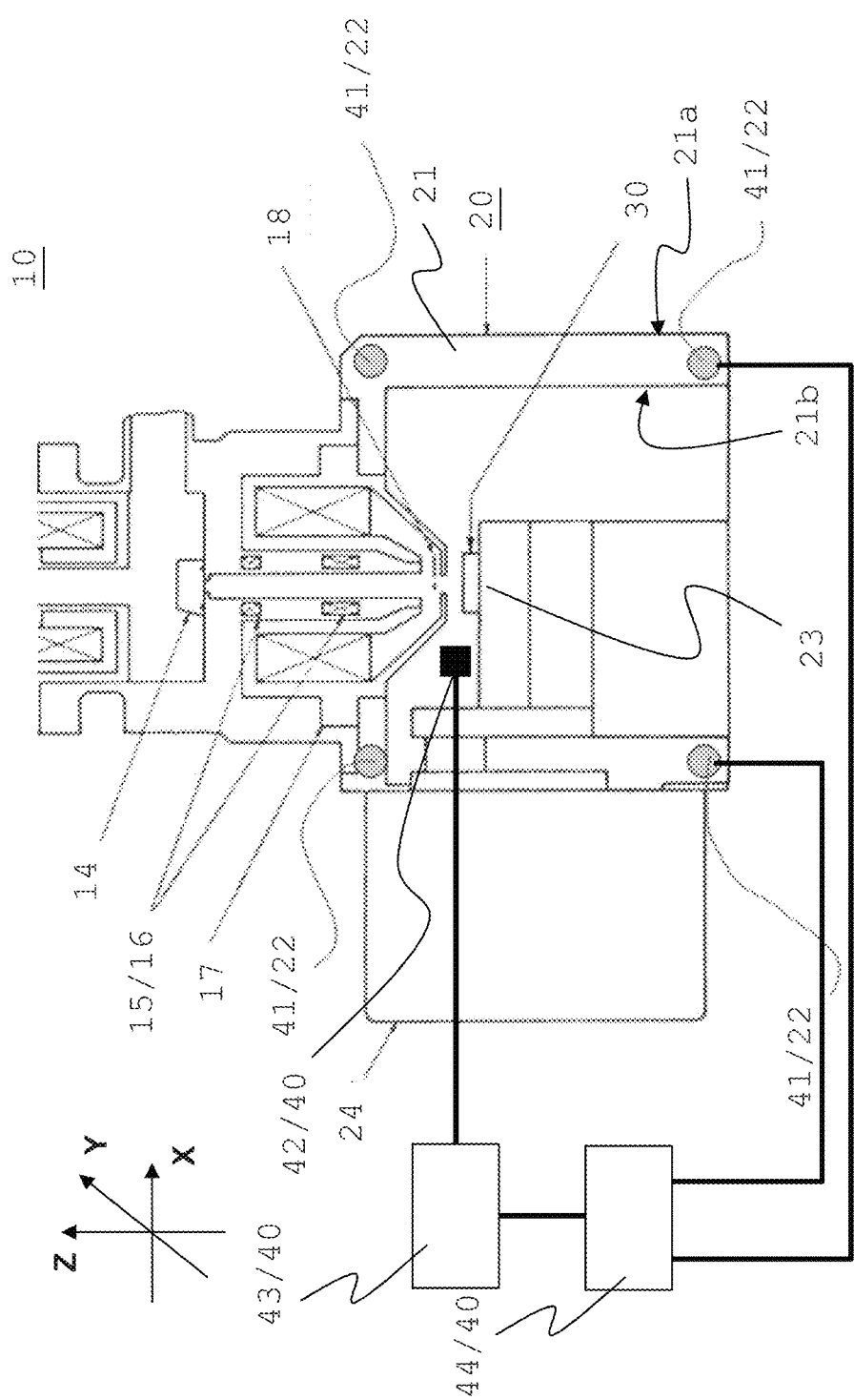
Fig. 2.b

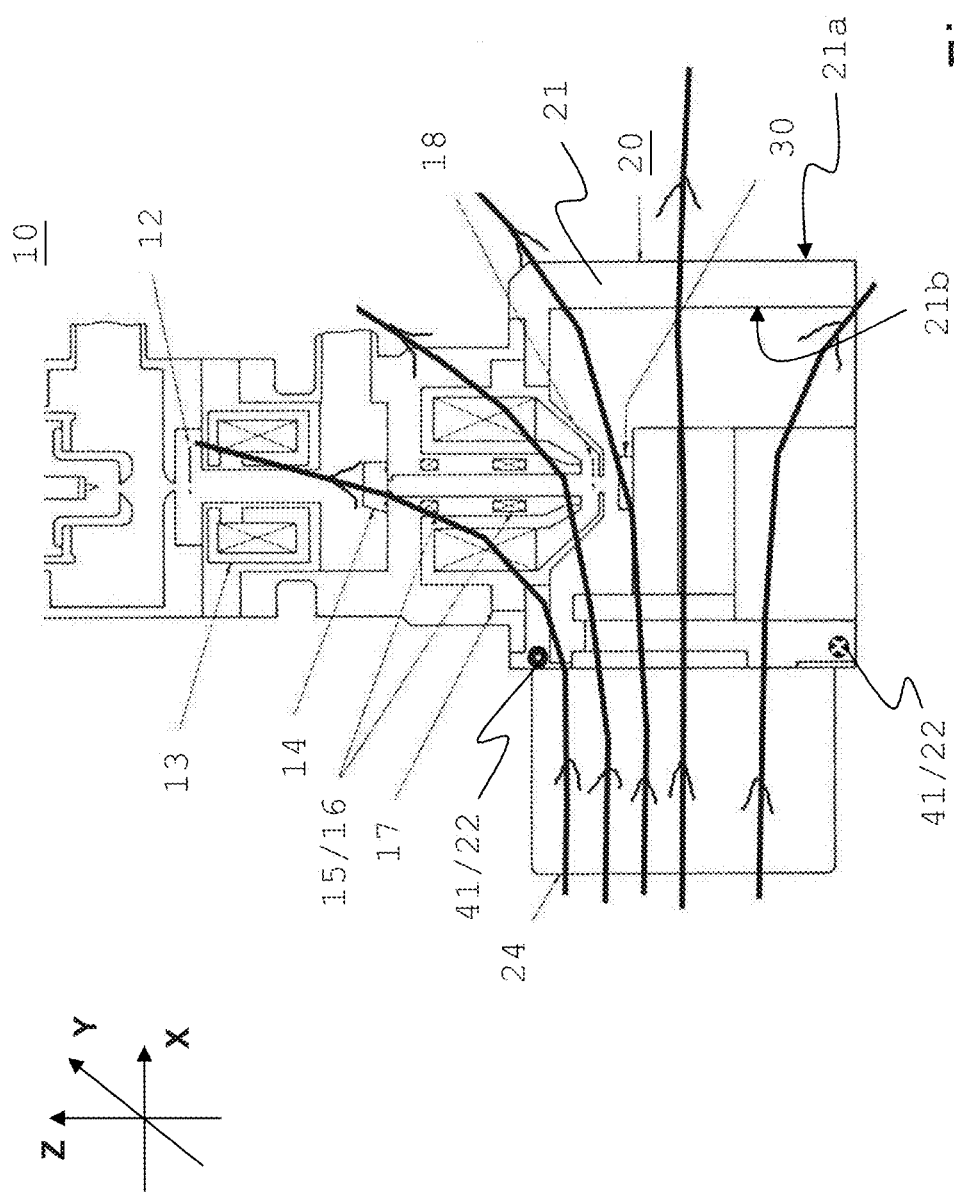
Fig. 3.a

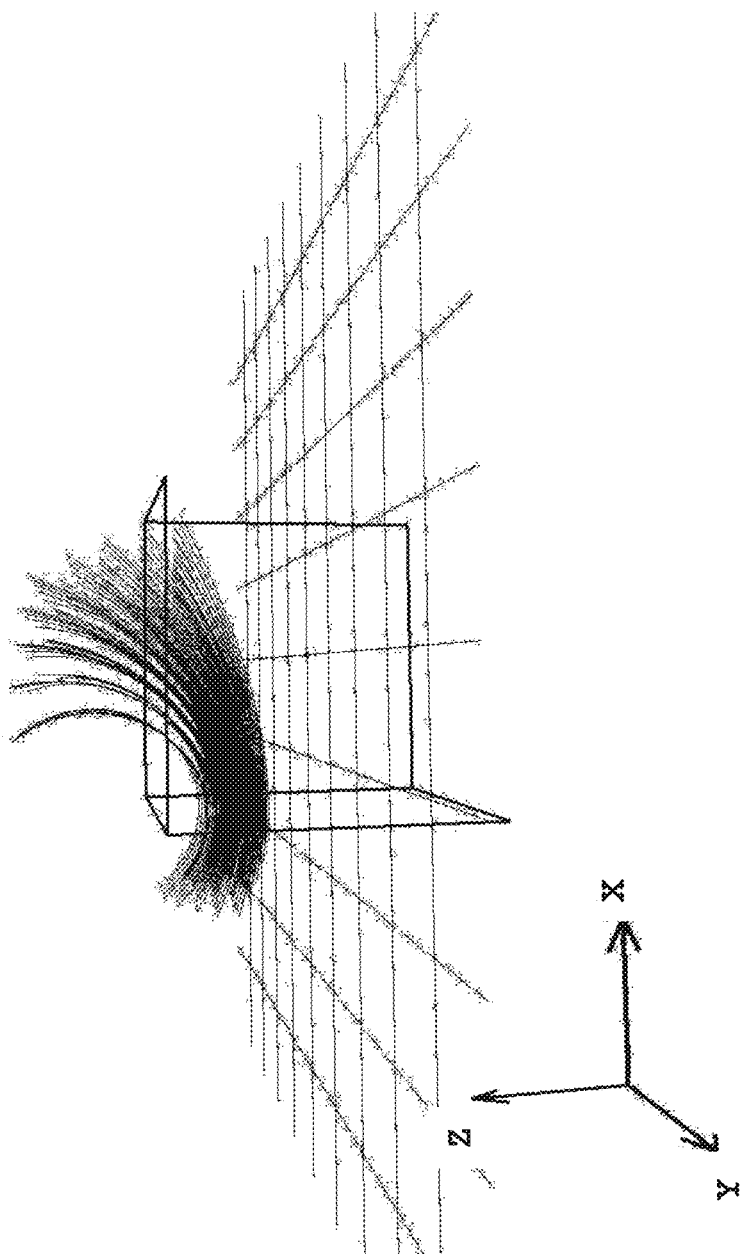
Fig. 3.b

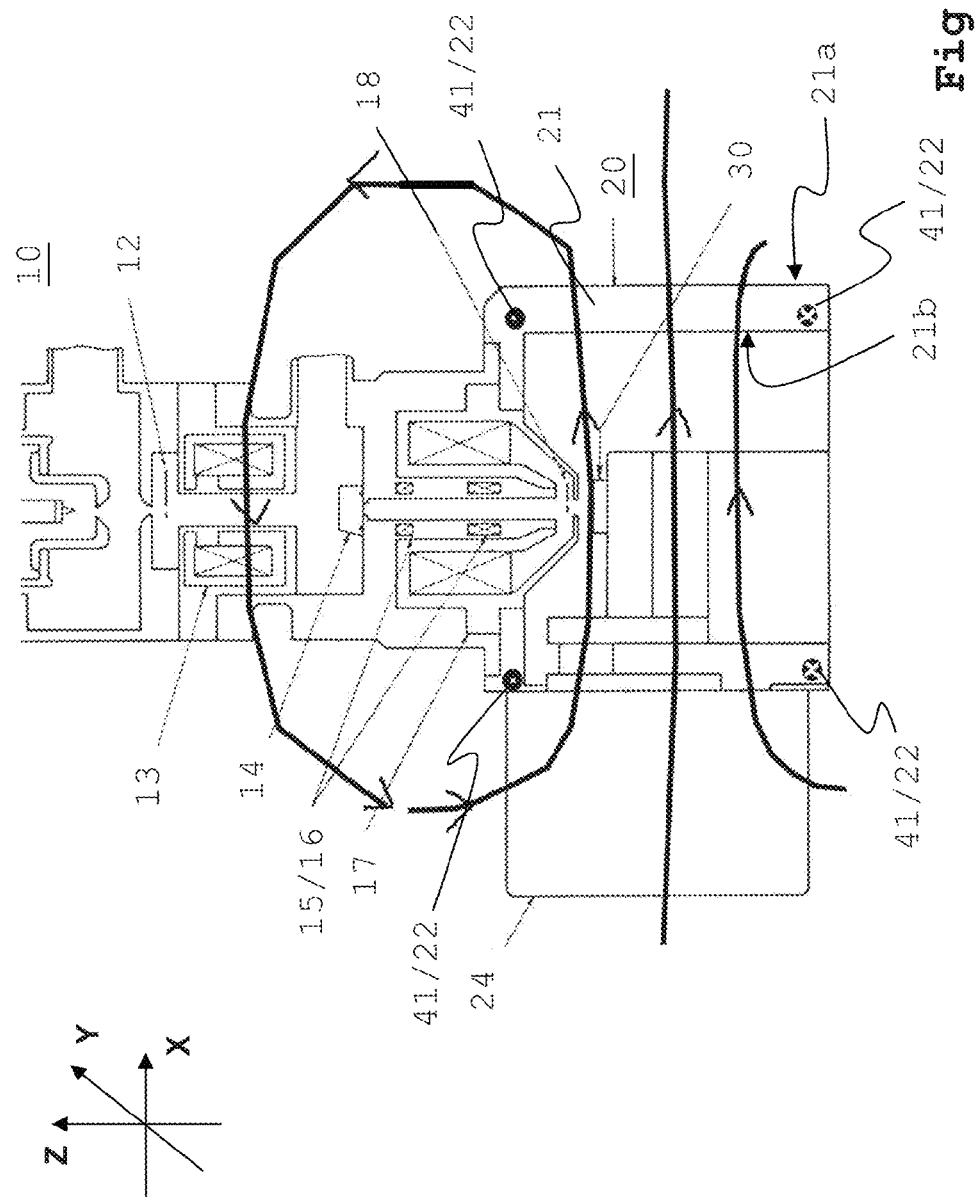

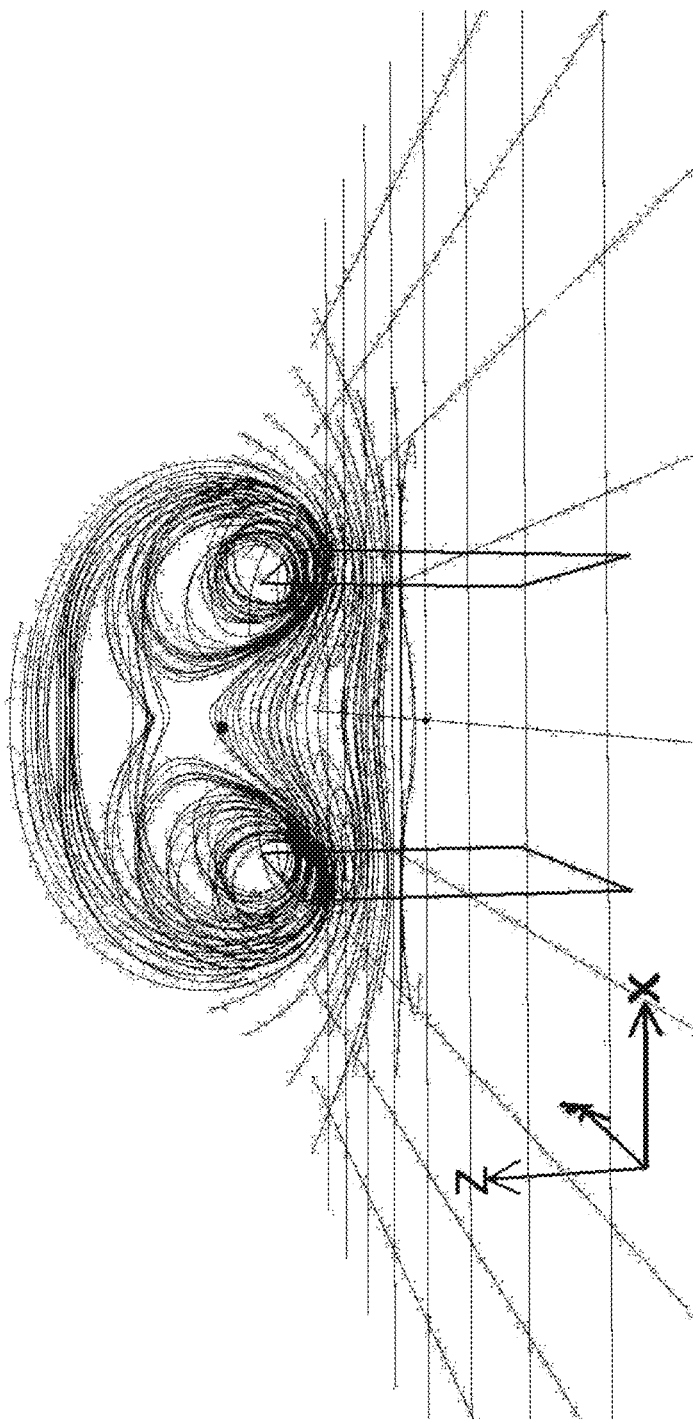
Fig. 4.b

INTEGRABLE MAGNETIC FIELD COMPENSATION FOR USE IN SCANNING AND TRANSMISSION ELECTRON MICROSCOPES

CROSS-REFERENCE TO RELATED APPLICATIONS

German patent application DE 10 2011 106 433.1, filed on Jul. 4, 2011, is incorporated herein by reference.

FIELD OF THE INVENTION

The present invention relates to an arrangement and a method for imaging, examining and/or processing a sample using electrons, the arrangement comprising a transmission or scanning electron microscope and a system for magnetic field compensation.

BACKGROUND OF THE INVENTION

Magnetic field compensation according to the feedback control principle is known. A spatial volume which is also referred to herein as a compensation volume is made virtually or substantially field-free, through destructive interference. To this end, a feedback sensor determines the magnetic interference field, for example the geomagnetic field, near the object to be protected and supplies this signal to a control unit. Based on the sensor signals, the control unit calculates a compensation current which is fed to the compensation coils. These coils will then generate a field which in the ideal case destructively superimposes to the interference field such that the amplitude of interference is minimized or at least substantially reduced.

Especially apparatus working with accelerated electrons, such as scanning and/or transmission electron microscopes, suffer from electromagnetic interference, because the latter directly affects the trajectory of the electrons required for imaging and thus the quality of the results.

Typical installations for such devices include a compensation structure in form of a three-axes twin-coil system, which is usually designed as a cube. In this case, the respective opposite sides of the cube are used as a pair of coils for generating a compensation field as homogeneous as possible. Inside this volume enclosed by the coils the device to be protected is then installed so that it can be operated in a virtually field-free space.

According to another prior art, only a single coil is provided per spatial direction or per axis instead of a respective pair of coils per spatial direction. The compensation field is then much more inhomogeneous, however, it is usually sufficient and economizes three coil structures.

All prior art configurations provide a sensor within the volume, because the control generally operates according to a feedback process. Thus, besides the cables that may be laid on the floor and via which the compensation coils are provided or wound, there is a sensor in the immediate vicinity of the device. So due to the construction of the arrangement, the operating comfort of the device is impaired.

SUMMARY OF THE INVENTION

Given this background, an object of the present invention is to provide a system and a method for magnetic field compensation, in particular for scanning and/or transmission electron microscopy (SEM and TEM), which at least mitigate the drawbacks of the prior art described above.

In particular, it should be possible to integrate the invention into existing control concepts or to upgrade the known control concepts.

Especially the specific conditions in terms of operating comfort of the device and the device-specific properties are to be considered.

These objects mentioned above are achieved by an arrangement and a method for imaging, examining and/or processing a sample, such as a wafer, using electrically charged particles, in particular electrons.

Generally, the invention can be described by the fact that the system for magnetic field compensation, in particular the compensation coils, is/are integrated into the actual device or arrangement in such a manner that the operating comfort of the arrangement is not significantly affected.

It is proposed here that a chamber in which a sample is arranged, for example a vacuum chamber, is considered, itself and preferably alone, as a compensation volume. In particular it is proposed here to relate or reduce the compensation volume to the sensitive point or region, for example of SEM and/or TEM devices. Since it has been found that, when subjected to external electromagnetic interference, for example, an electron beam is affected most sensitively in terms of image quality in a vacuum chamber shortly after a final focusing and/or filtering.

First, the present application claims an arrangement for imaging, examining and/or processing a sample using electrically charged particles, in particular electrons, comprising
 a device for providing electrically charged particles;
 a chamber with a sample holder on which a sample is positionable such that it can be imaged, examined and/or processed using the particles providable by said device; and
 a system for magnetic field compensation in at least one spatial direction, including at least one compensation coil which is provided by at least one turn of a conductor, wherein
 at least one wall of said chamber has at least one accommodation area, at least in sections thereof, for at least one portion of said compensation coil.

In a preferred embodiment, the device for providing the electrically charged particles is provided in form of an electron microscope, for example a scanning electron microscope and/or a transmission electron microscope. In another embodiment, the device for providing the electrically charged particles is provided in form of a lithographic device.

The chamber is preferably provided as a vacuum chamber. The compensation coil, in particular its conductor, is associated with the wall of the chamber. A wall in the present context is to be understood as the lateral walls, the bottom and the lid of the chamber.

In one embodiment of the invention, the area for receiving the conductor, or accommodation area, is provided by an outer surface and/or an inner surface of the chamber wall. The compensation coil, in particular the conductor thereof, is arranged at least partially on the outer surface and/or inner surface of the chamber wall. For example, the at least one turn of the conductor is laid along the chamber wall.

In an alternative or complementary embodiment, the accommodation area or section for receiving the compensation coil, in particular the conductor thereof, is provided by a recess which at least partially extends into the chamber wall. The recess may for example be provided as some kind of trench or indentation in the outer surface and/or the inner surface of the chamber wall. In this variation of the invention a sort of open recess is provided, and portions of or the complete conductor or compensation coil may be laid countersunk in this recess.

Preferably, however, the recess is formed as a cavity in the chamber wall. In this variation a sort of closed recess is provided, for example some kind of a tube, into which portions of or the complete conductor or compensation coil may be inserted.

The compensation coil, in particular the conductor thereof, may be directly connected to the chamber, for example by directly placing the conductor on the chamber wall and/or introducing it into the chamber wall.

However, it is likewise possible for the compensation coil, in particular the conductor, to be indirectly coupled with the chamber, for example via a frame around which the conductor is wound for providing the turns.

It may be sufficient to compensate for the magnetic interference field in only one plane perpendicular to the flight or beam direction of the electrically charged particles. This plane is generally provided by the horizontal plane.

However, in order to be able to substantially fully compensate for the magnetic interference field, the interference field is preferably compensated both in the horizontal plane and along the vertical. The X and Y coordinates define the horizontal plane, and the Z coordinate defines the vertical.

In one embodiment, each spatial direction X, Y, Z has associated therewith at least one compensation coil, so that a magnetic interference field may be compensated for in the three, i.e. all, spatial directions X, Y, and Z.

It may be possible in this case that each spatial direction X, Y, and Z or at least one spatial direction X, Y, or Z has associated therewith only a single compensation coil.

It is also possible that each single compensation coil has associated therewith another coil, preferably on the same axis. So a pair of compensation coils is formed. In one embodiment, each spatial direction has associated therewith at least one pair of compensation coils, so that a magnetic interference field can be compensated for in all three spatial directions X, Y, and Z.

In addition to the at least one compensation coil for generating a magnetic compensation field, the system for magnetic field compensation comprises at least one sensor for detecting or measuring a magnetic interference field, at least one power supply for the at least one compensation coil, and a means for controlling and/or regulating the current in the at least one compensation coil in function of the detected or measured magnetic interference field.

The pair of compensation coils may be connected and/or controllable in a manner that it is possible to power only a single compensation coil of the pair of compensation coils.

The compensation coil or the compensation field generated thereby provides or defines a compensation volume in which the magnetic interference field is substantially compensated for. The compensation volume describes the region of the magnetic field generated by the compensation coil which is suitable to compensate for a magnetic interference field, preferably sufficiently homogeneous.

The invention proposes to limit in particular the provided compensation volume to the minimum necessary, or at least to reduce it to a region that includes the sensitive point of SEM/TEM devices. According to the invention, a reduction of the compensation volume is in particular achieved by associating the at least one compensation coil with the chamber. It is suggested here to consider the chamber itself in which the sample is arranged, and preferably the chamber alone as the compensation volume. Thus, it is no longer the entire arrangement which is considered as the compensation volume as has been customary in the prior art. The compensation volume is preferably limited to a region within the chamber.

Moreover covered by the invention is a method for imaging, examining and/or processing a sample using electrically charged particles, in particular electrons, wherein
the electrically charged particles are provided; and
are directed to a sample arranged inside a chamber; and
wherein, in a compensation volume generated by at least one compensation coil, a magnetic field is provided such that a magnetic interference field can be compensated for along a portion of a trajectory of the particles; wherein
the compensation volume is provided in a region following a final influence on the electrically charged particles, such as focusing and/or filtering.

The inventive method is in particular practicable using the arrangement according to the invention described above. The arrangement according to the invention is in particular adapted to perform the inventive method.

The compensation volume provided by the coils comprises a region of interaction between the electrically charged particles and the sample. In particular, the compensation volume is substantially limited to a region, in which it is for example not intended any more to control the trajectory of the particles and/or the shape of the particle beam from the outside.

In order to allow for most precise imaging, examining and/or processing of a sample, the arrangement is generally mounted in vibration isolated manner.

Vibration isolation is to be understood as counteracting the disturbing movements or vibrations to which the system is subjected. In the ideal case, the movement or vibration is compensated for. This is preferably done in all six degrees of freedom of the movement. Therefore, it is often referred to as vibration compensation.

Also within the scope of the present invention is a vibration isolation system comprising at least one arrangement according to the invention that is mounted in vibration-isolated manner. It may be provided as an active and/or a passive vibration isolation system.

A passive vibration isolation system is distinguished by a "simple" mounting with minimized mechanical rigidity to reduce the transmission of external vibrations to the load to be isolated. An air bearing and a polymer spring element for mounting purposes are two examples of a passive vibration isolation system.

In contrast to passive vibration isolation which is characterized by some kind of damping the vibration or some kind of "isolated" mounting of the load, active vibration isolation is distinguished by the fact that the vibration is actively compensated for. A movement which is induced by a vibration is compensated for by a corresponding counter-movement. For example, a vibration-induced acceleration of a mass is counteracted by an acceleration with the same magnitude but with the opposite sign. The resulting overall acceleration of the load is zero. The load remains at rest, i.e. in the desired position.

Therefore, active vibration isolation systems, optionally combined with a mounting arrangement with minimized mechanical rigidity, in addition include a control system comprising a controller as well as sensors and actuators, which selectively counteract vibrations that penetrate into the system from the outside. The sensors detect movements of the load to be mounted. The controller generates compensation signals, by which the actuators are driven and thus compensating movements are produced. It is possible to use digital or analog control paths, or to combine both to so-called hybrid control paths.

BRIEF DESCRIPTION OF THE DRAWINGS

The present invention will now be described in detail by means of the following exemplary embodiments. To this end, reference is made to the accompanying drawings. The same reference numerals in the individual drawings refer to the same parts.

FIGS. 1.a through 1.c schematically show a cross section of an exemplary scanning electron microscope (FIG. 1a), the associated beam guidance (FIG. 1.b), and a magnetic compensation field generated by a pair of coils (FIG. 1.c).

FIGS. 2.a and 2.b schematically show two exemplary embodiments of positions of the compensation coils at the walls of a vacuum chamber.

FIGS. 3.a and 3.b schematically show the distribution of a magnetic compensation field which is provided by a single compensation coil, in a plane representation together with the arrangement (FIG. 3.a), and in a spatial representation (FIG. 3.b).

FIGS. 4.a and 4.b schematically show the distribution of a magnetic compensation field which is provided by a pair of compensation coils, in a plane representation together with the arrangement (FIG. 4a), and in a spatial representation (FIG. 4.b).

DETAILED DESCRIPTION OF THE INVENTION

Figure 5:
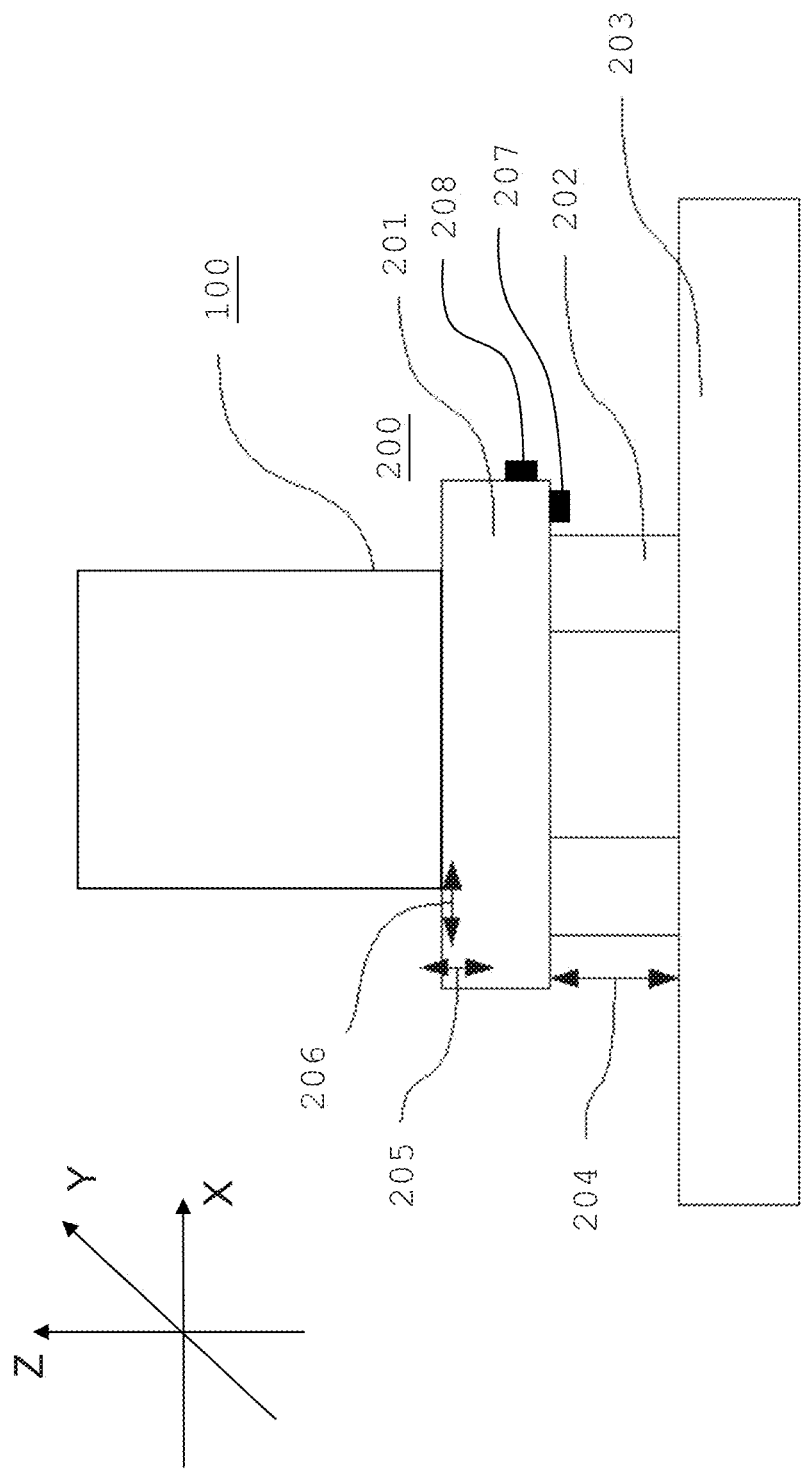
FIG. 5 schematically shows an exemplary active vibration isolation system with an arrangement according to the invention mounted in vibration-isolated manner.

The present invention will now be illustrated by way of the example of a scanning electron microscope 10. For this purpose, FIG. 1.a shows a cross-section of scanning electron microscope 10. FIG. 1.b shows an associated electron beam guidance 1. The function thereof is only briefly outlined: electrons 1 are generated by an electron gun 11 as electrically charged particles. By applying an extraction and an acceleration voltage, the electrons 1 are directed to sample 30. A plurality of beam focusing means and/or deflecting means and/or apertures are arranged in the beam path to be able to adjust the trajectory and/or the shape of the electron beam 1 and/or the imaging properties accordingly.

Exemplary means provided for this purpose are a first aperture 12 for monitoring the beam, a condenser lens 13, first and second deflectors, 15 and 16, in particular for scanning the sample 30, an objective lens 17, and a lens aperture 18 as the last aperture before sample 30, which preferably is arranged movably for scanning sample 30. A valve 14 is also arranged in the beam path.

Sample 30 is disposed in a chamber 20 on or at a sample holder 23. The position of sample 30 or sample holder 23 relative to the electron beam 1 can be changed, for example by a manipulator 24.

Arrangement 100 comprises electron microscope 10 and chamber 20. Inside scanning electron microscope 10 and inside chamber 20 a vacuum is applied. Electrons 1 impinge on sample 30 and release secondary electrons there. The latter allow to conclude about the properties of sample 30 to be examined. By scanning sample 30, the latter can be examined point by point. For example, the backscattered electrons may be detected by a detector, not shown, and may then be examined.

In addition, two compensation coils 41 are depicted here. These two coils 41 together form a pair of compensation coils to compensate for a magnetic interference field, here in the sheet plane X-Z. Preferably, a respective pair of compensation coils is provided for each of the three spatial directions X, Y, and Z. A compensation coil 41 is provided by at least one turn of a conductor. Compensation coils 41 are components of a system 40 for magnetic field compensation. System 40 in turn is a component of arrangement 100.

Compensation coils 41 here extend around the entire arrangement 100. The illustrated arrangement 100 is an arrangement 100 known from prior art. It is intended to make the whole spatial volume enclosed by compensation coils 41 virtually field-free, through destructive interference. The entire arrangement 100 is considered as the compensation volume. In particular due to the large dimensions of compensation coils 41, the operating comfort of the arrangement 100 is affected. FIG. 1.c shows the magnetic compensation field for the entire spatial volume along the X axis.

The invention suggests to reduce the compensation volume to the most sensitive region of arrangement 100. It has been found that, when subjected to external electromagnetic interferences, the electron beam 1 is most sensitively influenced in terms of image quality in the vacuum chamber 20 of the devices, especially shortly following the last focusing and/or filtering, in particular by objective lens 17 and/or lens aperture 18.

The compensation volume generated by coils 41 is provided substantially only in the volume between objective lens 17 or last aperture 18 and an upper surface of sample 30, onto which the electron beam 1 impinges. The provided compensation volume comprises the region of interaction between electron beam 1 and sample 30. For this purpose, coil 41 or at least a portion of one turn of the conductor is associated with wall 21 of chamber 20. In and/or at the wall 21 of chamber 20, at least in portions thereof, an accommodation area for coil 41, in particular the conductor thereof, is provided.

FIGS. 2.a and 2.b illustrate two examples of an accommodation area in and/or at the chamber wall 21 for arranging compensation coils 41 at and/or in the walls 21 of a vacuum chamber 20.

In a first embodiment, the accommodation area is provided by an outer surface 21a of chamber wall 21. Coil 41, or the conductor, is laid along wall 21 of chamber 20. The compensation coil cable is laid outside along vacuum chamber 20, preferably directly at the outer surface 21a of chamber wall 21. In FIG. 2.a, a first coil 41 is installed on the upper outer surface 21a of chamber wall 21, and a second coil 41 is installed on the lower outer surface 21b of chamber wall 21. First and second coils 41 form a pair of coils.

In a second embodiment, the accommodation area is produced and provided by a cavity 22 in chamber wall 21. Cavities are provided in the wall 21 of vacuum chamber 20 for the installation of compensation cables.

A compensation coil 41 has a size adapted to the size of chamber 20. Generally, the at least one compensation coil 41 has an average diameter of less than 100 cm, preferably less than 50 cm, more preferably less than 30 cm.

Both FIGS. 2.a and 2.b, additionally depict a sensor 42 for detecting or measuring the magnetic field inside chamber 20, a power supply 44 for coils 41, and a controller unit 43 for regulating and/or controlling the coil current. The coil current and thus the magnetic compensation field generated by coils 41 is regulated in function of the measured magnetic field. System 40 for magnetic field compensation is formed by compensation coils 41, sensor 42, controller unit 43, and power supply 44.

With both configurations it is possible to operate coil pairs per spatial direction, or to drive only a single coil 41 per spatial direction. This may for example be implemented by dynamic configurability in the controller unit. The appropriate operating mode can be selected. It depends on the specific features of the device and the nature of the compensation field required therefor.

A single coil 41 generates a rather inhomogeneous field. It deviates from the horizontal direction by radiating in the vertical direction Z above vacuum chamber 20. For devices that are less sensitive in Z direction, this may be the better alternative than a pair of coils. For illustration purposes, FIGS. 3.a and 3.b show the distribution of the magnetic compensation field which is provided by only a single compensation coil 41.

In contrast, FIGS. 4.a and 4.b show the distribution of a magnetic compensation field which is provided by a pair of compensation coils. Indeed, a pair of coils produces a homogeneous field. However, it reverses its direction above the vacuum chamber 20, like a dipole field. Since it can be assumed that the external interference is uniform throughout this small volume, the external interference would be amplified here. It depends on the device itself, whether this effect is relevant or not above preferably about twice the height of the vacuum chamber. Since a final focusing and/or filtering takes place shortly after the entry into vacuum chamber 20. In addition, the amplitude of the dipole field exhibits a minimum in a region above and between the two vortices. Eventually, the amplitude is also significantly reduced in the further far-field.

It depends on the individual case, which excitation should be selected. The choice of the excitation may for example be effected by a configurable software. Preferably, magnetic field compensation is based on the principle of feedback control. Controller 43 relies on received sensor signals which are proportional to the magnetic interference field. To this end, a sensor 42 is arranged within the compensation volume or zone of interaction between electrons 1 and sample 30 (see FIGS. 2.a and 2.b). Sensor 42 may also be referred to as a feedback sensor.

The feedback sensor 42 provided herein is a magnetic field sensor 42 with a vacuum compatible design, for example with a ceramic casing. Preferably, sensor 42 should be sized as small as possible. In particular, sensor 42 is in form of a chip-based sensor 42. An example of such a sensor 42 is described for example in patent application DE 10 2009 024 268 A1. An example of a controller 43 is described for example in patent application EP 1 873 543 A1. The subject matter of this two cited patent applications is fully incorporated into the present application by reference.

The compensation volume is in a range of less than $10^6$ cm$^3$, preferably less than 125000 cm$^3$, more preferably less than 27000 cm$^3$. Examples for the corresponding edge lengths are 100 cm*100 cm*100 cm; 50 cm*50 cm*50 cm; and/or 30 cm*30 cm*30 cm. Because of the small dimensions of the compensation volume and hence the small impedance of the compensation coils enclosing this volume, a very large regulation bandwidth may be provided, for example of more than 50 kHz. Moreover, it is in particular possible to use any trivial electronic circuit as a feedback controller 43, since the transfer functions are trivial.

Finally, FIG. 5 shows the inventive arrangement 100 with a vibration isolation system 200 which here by way of example is provided in form of an active vibration isolation system 200 based on pneumatic isolators 202. Arrangement 100, as the mass to be isolated, is mounted vibration-isolated relative to a floor 203 by means of pneumatic isolators 202.

For active vibration isolation, system 200 comprises for example four pneumatic isolators 202, a plurality of actuators 207 and 208, and a plurality of sensors 204, 205, and 206 as vibration signal transmitters. Sensors 204, 205, and 206 permit to detect vibrations or, more generally, movements of the base mass 201 and of the load 100 to be isolated, and to convert them into signals to be passed to a control system which is not shown here. Sensors 204, 205, and 206, as vibration signal transmitters, thus provide the sensor signals representing the vibrations.

Pneumatic isolators 202 are equipped for example with an optionally electronically controllable valve. Thus a pneumatic isolator 202 together with the valve forms an actuator with vertical operating direction Z. Isolators 202 and actuators 207 and 208 counteract the vibrations.

For the sake of a better overview, only part of the components are depicted in the figure. In the illustrated example, sensors 204, 205 and 206, and actuators 207 and 208 are only shown for two degrees of freedom, X and Z.

The sensors for example constitute speed sensors, acceleration sensors, and/or position sensors. For exemplary purposes, FIG. 5 illustrates a position sensor 204, and a speed and/or acceleration sensor in the vertical direction 205, and in the horizontal direction 206. Examples of sensors 204, 205, and 206 are geophone sensors and/or piezoelectric sensors. Examples of the actuators or force actuators 207 and 208 are Lorentz motors and/or piezoelectric actuators.

It will be apparent to a person skilled in the art that the described embodiments are to be understood as examples. The invention is not limited to these embodiments, rather it may be varied in many ways without departing from the spirit and scope of the invention. Features of individual embodiments may be combined with each other and with the features mentioned in the general part of the specification.

LIST OF REFERENCE NUMERALS

1 Electrically charged particles, or electrons, or electron beam
10 Device for providing electrically charged particles, or electron microscope
11 Electron source, or electron gun
12 First aperture for beam monitoring
13 Condenser lens
14 Valve
15 Magnetic or electric deflection means
16 Magnetic or electric deflection means
17 Objective lens
18 Lens aperture, or last aperture
20 Chamber or vacuum chamber for the sample
21 Chamber wall
21a Outer surface of the chamber wall
21b Inner surface of the chamber wall
22 Recess or cavity in the chamber wall
23 Sample holder
24 Manipulator
30 Sample, or target
40 System for magnetic field compensation
41 Coil, or compensation coil, or pair of coils, or pair of compensation coils
42 Sensor for detecting a magnetic field
43 Means for adjusting and/or controlling the current in the coil
44 Power supply
100 Arrangement for imaging, examining and/or processing a sample
200 Vibration isolation system
201 Isolated mass, or base mass, or isolated table
202 Pneumatic isolator, or vibration isolator, or air bearing with valve
203 Floor or base
204 Position sensor 205 Speed sensor or acceleration sensor in vertical direction
206 Speed sensor or acceleration sensor in horizontal direction
207 Actuator with vertical operating direction
208 Actuator with horizontal operating direction

What is claimed is:

1. An arrangement for imaging, examining and/or processing a sample using electrically charged particles, comprising
   a device for providing electrically charged particles;
   a chamber with a sample holder on which the sample is positionable such that the sample can be imaged, examined and/or processed using the particles providable by said device; and
   a system for magnetic field compensation in at least one spatial direction (X, Y, Z), including at least one compensation coil which is provided by at least one turn of a conductor,
   wherein at least one wall of said chamber has at least one accommodation area, at least in sections thereof, for at least one portion of said compensation coil.

2. The arrangement as claimed in claim 1, wherein said accommodation area is provided by an outer surface and/or an inner surface of the chamber wall, and wherein said compensation coil is arranged, at least partially, on the outer surface and/or the inner surface of the chamber wall.

3. The arrangement as claimed in claim 1, wherein said accommodation area is provided by a recess which at least partially extends into the chamber wall.

4. The arrangement as claimed in claim 3, wherein said recess is formed as a cavity in the chamber wall.

5. The arrangement as claimed in claim 1, wherein each spatial direction (X, Y, Z) has associated therewith at least one compensation coil, so that a magnetic interference field can be compensated for in the three spatial directions (X, Y, Z).

6. The arrangement as claimed in claim 1, wherein each spatial direction (X, Y, Z) has associated therewith at least one pair of compensation coils, so that a magnetic interference field can be compensated for in the three spatial directions (X, Y, Z).

7. The arrangement as claimed in claim 6, wherein said system for magnetic field compensation is adapted to excite one single compensation coil the pair of compensation coils, or said pair of compensation coils.

8. A vibration isolation system, comprising at least one arrangement as claimed in claim 1 mounted in vibration-isolated manner.

9. A method for imaging, examining and/or processing a sample using electrically charged particles; wherein
   the electrically charged particles are provided and are directed to a sample arranged inside a chamber; and
   in a compensation volume generated by at least one compensation coil, a magnetic field is provided such that a magnetic interference field can be compensated for along a portion of a trajectory of said particles; wherein
   said compensation volume is provided in a region following a final influence on the electrically charged particles, such as focusing and/or filtering.

* * * * *